(12) United States Patent
Ito et al.

(10) Patent No.: US 8,129,612 B2
(45) Date of Patent: Mar. 6, 2012

(54) METHOD FOR MANUFACTURING SINGLE-CRYSTAL SILICON SOLAR CELL AND SINGLE-CRYSTAL SILICON SOLAR CELL

(75) Inventors: Atsuo Ito, Tokyo (JP); Shoji Akiyama, Gunma (JP); Makoto Kawai, Gunma (JP); Koichi Tanaka, Gunma (JP); Yuuji Tobisaka, Gunma (JP); Yoshihiro Kubota, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 449 days.

(21) Appl. No.: 12/076,916

(22) Filed: Mar. 25, 2008

(65) Prior Publication Data

US 2008/0245408 A1 Oct. 9, 2008

(30) Foreign Application Priority Data

Apr. 9, 2007 (JP) ................... 2007-101781

(51) Int. Cl.
*H01L 31/04* (2006.01)
*H01L 31/028* (2006.01)
(52) U.S. Cl. ............. 136/255; 438/69; 257/E31.11
(58) Field of Classification Search .............. 136/255
See application file for complete search history.

(56) References Cited

U.S. PATENT DOCUMENTS

| | | | |
|---|---|---|---|
| 4,427,839 A | 1/1984 | Hall | |
| 4,773,942 A * | 9/1988 | Hamakawa et al. | 136/244 |
| 4,927,770 A | 5/1990 | Swanson | |
| 5,030,295 A * | 7/1991 | Swanson et al. | 136/256 |
| 5,374,564 A | 12/1994 | Bruel | |
| 5,646,432 A | 7/1997 | Iwaki et al. | |
| 5,665,607 A | 9/1997 | Kawama et al. | |
| 5,956,571 A | 9/1999 | Yang | |
| 5,972,732 A | 10/1999 | Gee et al. | |
| 5,985,742 A | 11/1999 | Henley et al. | |

(Continued)

FOREIGN PATENT DOCUMENTS

DE 199 36 941 A1 5/2000

(Continued)

OTHER PUBLICATIONS

Takahashi et al., "Taiyo-ko Hatuden (Photovoltaic Power Generation)"; *Morikita Shuppan*; pp. 217 and pp. 233; 1980.

(Continued)

*Primary Examiner* — Jeffrey T Barton
*Assistant Examiner* — Magali P Slawski
(74) *Attorney, Agent, or Firm* — Oliff & Berridge, PLC (57) ABSTRACT

There is disclosed a method for manufacturing a single-crystal silicon solar cell including the steps of: implanting a hydrogen ion or a rare gas ion into a single-crystal silicon substrate; forming a transparent insulator layer on a metal substrate; performing a surface activation treatment with respect to at least one of the ion implanted surface and a surface of the transparent insulator layer; bonding these surfaces; mechanically delaminating the single-crystal silicon substrate to provide a single-crystal silicon layer; forming a plurality of second conductivity type diffusion regions in the delaminated surface side of the single-crystal silicon layer so that a plurality of first conductivity type regions and the plurality of second conductivity regions are present in the delaminated surface of the single-crystal silicon layer; respectively forming a plurality of individual electrodes on the plurality of first and second conductivity type regions of the single-crystal silicon layer; forming respective collecting electrodes; and forming a transparent protective film.

9 Claims, 2 Drawing Sheets

U.S. PATENT DOCUMENTS

| | | | |
|---|---|---|---|
| 6,013,563 | A | 1/2000 | Henley et al. |
| 6,048,411 | A | 4/2000 | Henley et al. |
| 6,331,208 | B1 | 12/2001 | Nishida et al. |
| 6,391,743 | B1 | 5/2002 | Iwane et al. |
| 6,426,235 | B1 | 7/2002 | Matsushita et al. |
| 6,555,443 | B1 | 4/2003 | Artmann et al. |
| 2002/0011590 | A1 | 1/2002 | Nagashima |
| 2003/0203547 | A1 | 10/2003 | Sakaguchi |
| 2004/0207485 | A1 | 10/2004 | Kawachi et al. |
| 2004/0229444 | A1 | 11/2004 | Couillard et al. |
| 2004/0248379 | A1 | 12/2004 | Maleville et al. |
| 2006/0169316 | A1 | 8/2006 | Thomsen et al. |
| 2008/0121275 | A1 | 5/2008 | Ito et al. |
| 2008/0121278 | A1 | 5/2008 | Ito et al. |
| 2009/0007960 | A1 | 1/2009 | Ito et al. |

FOREIGN PATENT DOCUMENTS

| | | |
|---|---|---|
| EP | 0 971 396 A1 | 1/2000 |
| JP | A-03-147346 | 6/1991 |
| JP | A-05-211128 | 8/1993 |
| JP | A-07-106617 | 4/1995 |
| JP | A-7-226528 | 8/1995 |
| JP | A-08-213645 | 8/1996 |
| JP | A-09-331077 | 12/1997 |
| JP | A-10-93122 | 4/1998 |
| JP | A-63-287077 | 11/1998 |
| JP | A-11-004008 | 1/1999 |
| JP | A-2000-150940 | 5/2000 |
| JP | A-2001-111080 | 4/2001 |
| JP | A-2001-189477 | 7/2001 |
| JP | A-2001-217443 | 8/2001 |
| JP | A-2003-017723 | 1/2003 |
| JP | A-2004-304622 | 10/2004 |
| JP | A-2004-342909 | 12/2004 |
| JP | A-2006-295037 | 10/2006 |
| JP | A-2006-324530 | 11/2006 |
| WO | WO 2006/093817 | 9/2006 |

OTHER PUBLICATIONS

Apr. 13, 2010 Office Action issued in Chinese Application No. 200710193656.X (with partial translation).
Nov. 27, 2009 Office Action issued in U.S. Appl. No. 12/073,437.
Feb. 23, 2010 Decision of Refusal issued in Japanese Application No. 2006-294608 (with translation).
Dec. 24, 2009 Office Action issued in U.S. Appl. No. 11/976,026.
Jan. 25, 2010 Office Action issued in U.S. Appl. No. 11/976,020.
Jan. 4, 2010 Office Action issued in U.S. Appl. No. 11/976,021.
Shah, A.V., et al., "Thin-film Silicon Solar Cell Technology," Progress in Photovoltaics: Research and Applications, vol. 12, pp. 113-142, 2004.
Dec. 18, 2009 Office Action issued in Chinese Application No. 200410185123.7 (with partial translation).
Dec. 8, 2009 Notification of Reasons for Refusal issued in Japanese Application No. 2007-56870 (with partial translation).
U.S. Office Action issued May 12, 2010 in related U.S. Appl. No. 12/073,437.
Dec. 15, 2010 Japanese Notification of Reasons for Refusal issued in JP-2007-056870 (with Translation).
Dec. 21, 2010 Japanese Outline of a Questioning issued in JP-2006-294490 (with Translation).
Dec. 21, 2010 Japanese Outline of a Questioning issued in JP-2006-294605 (with Translation).
Dec. 21, 2010 Japanese Outline of a Questioning issued in JP-2006-294553 (with Translation).
Dec. 21, 2010 Japanese Outline of a Questioning issued in JP-2006-294608 (with Translation).
Jan. 26, 2011 Office Action issued in Chinese Application No. 2007101851256 (with translation).
Oct. 26, 2010 Office Action issued in U.S. Appl. No. 11/984,182.
Oct. 28, 2010 Office Action issued in U.S. Appl. No. 12/073,437.
May 24, 2011 Notification of Reasons for Refusal issued in Japanese Patent Application No. 2006-294553 with partial translation.
May 24, 2011 Notification of Reasons for Refusal issued in Japanese Patent Application No. 2006-294608 with partial translation.
May 24, 2011 Notification of Reasons for Refusal issued in Japanese Patent Application No. 2006-294490 with partial translation.
May 24, 2011 Notification of Reasons for Refusal issued in Japanese Patent Application No. 2006-294605 with partial translation.
Jul. 12, 2011 Office Action issued in U.S. Appl. No. 11/976,020.
May 13, 2011 Extended European Search Report issued in European Application No. 07022106.4.
May 13, 2011 Extended European Search Report issued in European Application No. 07020917.6.
May 13, 2011 Extended European Search Report issued in European Application No. 07020916.8.
May 13, 2011 Extended European Search Report issued in European Application No. 07020918.4.
Mar. 9, 2011 Office Action issued in Chinese Patent Application No. 200710185124.1 (with partial English-language translation).
Mar. 9, 2011 Office Action issued in Chinese Patent Application No. 200710185123.7 (with partial English-language translation).
Nov. 14, 2011 Office Action issued in U.S. Appl. No. 11/976,026.

* cited by examiner

METHOD FOR MANUFACTURING SINGLE-CRYSTAL SILICON SOLAR CELL AND SINGLE-CRYSTAL SILICON SOLAR CELL

BACKGROUND OF THE INVENTION

1. Field of the Invention

The present invention relates to a method for manufacturing a single-crystal silicon solar cell and a single-crystal silicon solar cell and, more particularly to a method for manufacturing a single-crystal silicon solar cell having a single-crystal silicon layer formed on a metal substrate and the single-crystal silicon solar cell.

2. Description of the Related Art

Solar cells produced using silicon as a principal raw material are classified into single crystal silicon solar cells, polycrystalline silicon solar cells, and amorphous silicon solar cells, depending on their crystallinity. Among these types, single crystal silicon solar cells are formed by slicing a single crystal ingot obtained by crystal pulling into wafers using a wire saw, processing each wafer to a thickness of 100 to 200 μm, and forming pn junctions, electrodes, a protective film, and the like on the wafer.

In case of the polycrystalline silicon, a polycrystalline ingot is manufactured by crystallizing molten metal silicon in a mold without pulling up a crystal, this is sliced into a wafer-like shape by a wire saw like the single-crystal silicon solar cell, and this is likewise processed into a wafer having a thickness of 100 to 200 μm, and p-n junctions, electrodes, a protective film, and others are formed, thereby obtaining a solar cell.

The amorphous silicon solar cell is obtained by decomposing a silane gas in a gas phase by discharge based on, e.g., a plasma CVD method to form an amorphous silicon hydride film on a substrate, adding diborane, phosphine, and others as a doping gas to be simultaneously deposited, and simultaneously effecting formation of p-n junctions and that of a film to form electrodes and a protective film. In the amorphous silicon solar cell, since amorphous silicon is of a direct transition type that absorbs an incident light, its optical absorption coefficient is approximately one digit higher (Kiyoshi TAKAHASHI, Yoshihiro HAMAKAWA, and Akio USHIROKAWA, "Taiyo-ko Hatsuden (Photovoltaic Power Generation)", Morikita Shuppan, 1980, p. 233) than those of single crystal and polysilicon, and hence there is an advantage that approximately 1 μm that is approximately 1/100 of a film thickness of a crystal-based solar cell can suffice as a thickness of the amorphous silicon layer. In recent years, a production volume of solar batteries has exceeded one gigawatt per year in the world. Considering a further growth of the production volume in the future, an expectation about the thin-film amorphous silicon solar cell which can effectively exploit resources is considerable.

However, in manufacture of the amorphous silicon solar cell, a high-purity gas raw material such as silane or disilane is used as a raw material, or members other than a substrate are deposited in a plasma CVD apparatus. Under the circumstances, an effective utilization ratio of the gas raw material as a resource cannot be determined based on simple comparison with a film thickness required for a crystal-based solar cell. Further, a conversion efficiency of a crystal-based solar cell is approximately 15% whereas that of the amorphous silicon solar cell is approximately 10%, and hence a problem of degradation in output characteristic in application of a light still remains.

On the other hand, developing a thin-film solar cell by using a crystal-based silicon material has been attempted in many ways (Kiyoshi TAKAHASHI, Yoshihiro HAMAKAWA, and Akio USHIROKAWA, "Taiyo-ko Hatsuden (Photovoltaic Power Generation)", Morikita Shuppan, 1980, p. 217). For example, a polycrystalline thin film is deposited on an alumina substrate or a graphite substrate by using, e.g., a trichlorosilane gas or a tetrachlorosilane gas. Since this deposited film has many crystal defects and a conversion efficiency remains low when this film is left as it is, zone melting must be carried out to improve crystallinity in order to raise the conversion efficiency (see, e.g., Japanese Patent Application Laid-open No. 2004-342909). However, even if such a method based on zone melting is adopted, there is a problem of, e.g., a reduction in photoelectric response characteristics in a long wavelength band due to a leak current at a crystal grain boundary or a decrease in a lifetime.

SUMMARY OF THE INVENTION

In view of the above-explained problem, it is an object of the present invention to provide a thin-film single-crystal silicon solar cell which has a light conversion layer formed as a thin film in order to effectively exploit silicon as a raw material of the silicon solar cell, excellent conversion characteristics, and less degradation due to irradiation of a light as a solar cell having a light confinement structure in which an efficiency is raised as much as possible for a film thickness, and also provide a manufacturing method thereof.

To achieve this object, according to the present invention, there is provided a method for manufacturing a single-crystal silicon solar cell in which at least a metal substrate, a single-crystal silicon layer as a light conversion layer, and a transparent protective film are laminated and the transparent protective film side serves as a light receiving surface, the method for manufacturing a single-crystal silicon solar cell comprising the steps of: preparing the metal substrate and a single-crystal silicon substrate which is of a first conductivity type; implanting at least one of a hydrogen ion and a rare gas ion into the single-crystal silicon substrate to form an ion implanted layer; forming a transparent insulator layer on the metal substrate; performing a surface activation treatment with respect to at least one of the ion implanted surface of the single-crystal silicon substrate and a surface of the transparent insulator layer on the metal substrate; bonding the ion implanted surface of the single-crystal silicon substrate to the surface of the transparent insulator layer on the metal substrate; giving an impact shock to the ion implanted layer and mechanically delaminating the single-crystal silicon substrate to provide the single-crystal silicon layer; forming a plurality of diffusion regions which are of a second conductivity type different from the first conductivity type in the delaminated surface side of the single-crystal silicon layer and forming a plurality of p-n junctions in at least a plane direction so that a plurality of first conductivity type regions and the plurality of second conductivity type regions are present in the delaminated surface of the single-crystal silicon layer; forming a plurality of first individual electrodes on the plurality of first conductivity type regions of the single-crystal silicon layer and forming a plurality of second individual electrodes on the plurality of second conductivity type regions of the same; forming a first collecting electrode connecting the plurality of first individual electrodes and a second collecting electrode connecting the plurality of second individual electrodes; and forming a transparent protective film that covers the plurality of first conductivity type regions and the plurality of second conductivity type regions.

According to the method for manufacturing a single-crystal silicon solar cell including such steps, it is possible to manufacture the thin-film single-crystal silicon solar cell having a light confinement structure in which the thin-film single-crystal silicon layer is provided as the light conversion layer and a light reflection metal layer is provided on an opposite side of the light receiving surface. Since this thin-film single crystal silicon solar cell is a solar cell having the light conversion layer as the single-crystal silicon layer, the solar cell having the conversion efficiency which is high for the film thickness and has less degradation due to light irradiation.

Further, according to the method for manufacturing a single-crystal silicon solar cell including such steps, since the single-crystal silicon layer as the light conversion layer is formed by delaminating this layer from the single-crystal silicon substrate, crystallinity of the single-crystal silicon layer can be improved. As a result, the conversion efficiency as the solar cell can be further increased.

Furthermore, since the single-crystal silicon substrate is bonded to the metal substrate having the transparent insulator film formed thereon after being subjected to a surface activation treatment, these substrates can be firmly bonded to each other. Therefore, sufficiently strong bonding can be carried out without performing a high-temperature heat treatment which increases a bonding power. Moreover, since bonding surfaces are firmly bonded in this manner, an impact shock can be then given to the ion implanted layer to delaminate the single-crystal silicon substrate, and the thin single-crystal silicon layer can be formed on the metal substrate having the transparent insulator film formed thereon. Therefore, a film thickness of the single-crystal silicon layer can be reduced without performing a heat treatment for delamination.

Additionally, delamination of the single-crystal silicon substrate for formation of the single-crystal silicon layer is carried out based on mechanical delamination without performing heating, and hence cracks or defects based on a difference in thermal expansion coefficient can be suppressed from being introduced into the light conversion layer.

Further, in order to provide the thin-film solar cell having the thin silicon layer, the silicon raw material can be economized and effectively utilized.

Furthermore, forming the metal substrate as the thin-film substrate enables providing the solar cell which can be spread in a curved surface shape, rolled to be accommodated, or spread to be used as required.

In this case, it is preferable that the metal substrate has a reflectivity of 60% or above with respect to a visible light.

When the metal substrate has the reflectivity of 60% or above with respect to a visible light, it is easy to fabricate the light confinement structure in which the visible light transmitted through the thin-film single-crystal silicon layer is reflected on the metal surface interface with the high reflectivity and again absorbed into the thin-film single-crystal silicon layer to be subjected to photoelectric conversion.

Moreover, it is preferable that the transparent insulator layer contains at least one of a silicon oxide, a silicon nitride, and an aluminum oxide.

When the transparent insulator layer contains at least one of the silicon oxide, the silicon nitride, and the aluminum oxide in this manner, a clean surface optimum for bonding can be readily obtained, and a metal component can be prevented from being diffused into the single-crystal silicon layer from the bonding surface.

Additionally, it is preferable that the surface activation treatment is at least one of a plasma treatment and an ozone treatment.

When the surface activation treatment is at least one of the plasma treatment and the ozone treatment in this manner, the surface activation can be readily performed, and the single-crystal silicon substrate can be firmly bonded to the transparent insulator layer on the metal substrate.

Further, it is preferable that a depth of the ion implantation is set to fall within the range of 2 µm to 50 µm from the ion implanted surface.

When the depth of ion impanation is set to fall within the range of 2 µm to 50 µm from the ion implanted surface in this manner, a thickness of the single-crystal silicon layer as the light conversion layer in the single-crystal silicon solar cell to be manufactured can be set to fall within the range of approximately 2 µm to 50 µm. Furthermore, when the single-crystal silicon solar cell having the thin-film single-crystal silicon layer with such a thickness is provided, the conversion efficiency which is practical for the thin-film single crystal silicon solar cell can be obtained, and an amount of the silicon raw material to be used can be saved.

Moreover, it is preferable that the transparent insulator layer has light scattering properties or the transparent protective film has light scattering properties.

When the transparent insulator layer or the transparent protective layer has light scattering properties in this manner, it is possible to manufacture the thin-film single crystal-silicon solar cell having the light confinement structure which can increase a light path length of a light entering the single-crystal silicon layer as the light conversion layer and allow the single-crystal silicon layer as the light conversion layer to absorb more light. As a result, the conversion efficiency can be further improved.

Additionally, the present invention provides a single-crystal silicon solar cell manufactured by the method for manufacturing a single-crystal silicon solar cell according to any one of the above-explained aspects.

According to the single-crystal silicon solar cell manufactured by the method for manufacturing a single-crystal silicon solar cell based on any one of the above-explained aspects, the single-crystal silicon layer as the light conversion layer can be formed by delamination from the single-crystal silicon substrate, and delamination of the single-crystal silicon layer can be effected based on mechanical delamination without performing heating, thereby providing the single-crystal silicon layer having high crystallinity. Therefore, the thin-film solar cell having the conversion efficiency which is high for the film thickness. Further, the light confinement structure having the light reflection metal layer on the opposite side of the light receiving surface can be provided.

Furthermore, according to the present invention, there is provided a single-crystal silicon solar cell, wherein at least a metal substrate, a transparent insulator layer, a single-crystal silicon layer, and a transparent protective film are sequentially laminated, a plurality of first conductivity type regions and a plurality of second conductivity type regions are formed in a surface of the single-crystal silicon layer in the transparent protective film side, a plurality of p-n junctions are formed in at least a plane direction, a plurality of first individual electrodes are respectively formed on the plurality of first conductivity type regions of the single-crystal silicon layer, a plurality of second individual electrodes are respectively formed on the plurality of second conductivity type regions of the same, and a first collecting electrode connecting the plurality of first individual electrodes and a second collecting electrode connecting the plurality of second individual electrodes are formed.

The single-crystal silicon solar cell having such a structure is a thin-film single-crystal silicon solar cell having a light confinement structure in which the thin-film single crystal silicon layer as a light conversion layer is provided and a light reflection metal layer is provided on the opposite side of a light receiving surface. This thin-film single-crystal silicon solar cell is a solar cell in which the light conversion layer is the single-crystal silicon layer, thereby providing the solar cell whose conversion efficiency is high for a film thickness and which is less degraded due to light irradiation.

In this case, it is preferable that the metal substrate has a reflectivity of 60% or above with respect to a visible light.

When the metal substrate has the reflectivity of 60% or above with respect to the visible light in this manner, it is possible to obtain the solar cell in which the visible light transmitted through the thin-film single-crystal silicon layer is reflected on the metal substrate interface with the high reflectivity and again absorbed into the thin-film single-crystal silicon layer to be subjected to photoelectric conversion.

Moreover, it is preferable that the transparent insulator layer contains at least one of a silicon oxide, a silicon nitride, and an aluminum oxide.

When the transparent insulator layer contains at least one of the silicon oxide, the silicon nitride, and the aluminum oxide in this manner, a metal component can be prevented from being diffused into the single-crystal silicon layer from the metal substrate.

Additionally, it is preferable that a film thickness of the single-crystal silicon layer falls within the range of 2 μm to 50 μm.

When the film thickness of the single-crystal silicon layer falls within the range of 2 μm to 50 μm in this manner, a conversion efficiency which is practical for the thin-film single crystal-silicon solar cell can be obtained, and an amount of the silicon raw material to be used can be economized.

Additionally, it is preferable that the transparent insulator layer has light scattering properties or the transparent protective film has light scattering properties.

When the transparent insulator layer or the transparent protective film has light scattering properties in this manner, it is possible to provide the thin-film single-crystal silicon solar cell having the light confinement structure which can further increase a light path length of a light entering the single-crystal silicon layer as the light conversion layer and allow the single-crystal silicon layer as the light conversion layer to absorb more light. As a result, the conversion efficiency can be further improved.

According to the method for manufacturing a single-crystal silicon solar cell conforming to the present invention, it is possible to manufacture the light confinement type thin-film solar cell in which the single-crystal silicon layer having excellent crystallinity and the high conversion efficiency is arranged as the light conversion layer on the metal substrate.

Further, according to the single-crystal silicon solar cell conforming to the present invention, there can be provided the light confinement type thin-film solar cell in which the single-crystal silicon layer having excellent crystallinity and the high conversion efficiency is arranged as the light conversion layer on the metal substrate, thereby realizing it as a solar cell whose conversion efficiency is high for its film thickness.

BRIEF DESCRIPTION OF THE DRAWINGS

FIGS. 2(a) and 2(b) are schematic cross-sectional views showing an example of the single-crystal silicon solar cell according to the present invention, in which

DETAILED DESCRIPTION OF THE PREFERRED EMBODIMENTS

As explained above, in a thin-film solar cell which can economize a silicon raw material, a higher conversion efficiency is likewise desired, and adopting a crystal-based solar cell to further improve crystallinity is demanded.

Thus, the present inventors examined this problem, and consequently discovered that crystallinity of a silicon layer as a light conversion layer can be enhanced by bonding a single-crystal silicon substrate to a metal substrate having a transparent insulator layer formed thereon through the transparent insulator layer and then reducing a film thickness of the single-crystal silicon substrate. Furthermore, they conceived that a bonding strength can be increased without performing a heat treatment at a high-temperature by activating surfaces of the single-crystal silicon substrate and the metal substrate having the transparent insulator layer formed thereon before bonding these substrates and the crystallinity of the single-crystal silicon layer can be excellently maintained by performing delamination based on mechanical delamination without performing a heat treatment at a high temperature, thereby bringing the present invention to completion.

An embodiment according to the present invention will now be specifically explained hereinafter, but the present invention is not restricted thereto.

Figure 1:
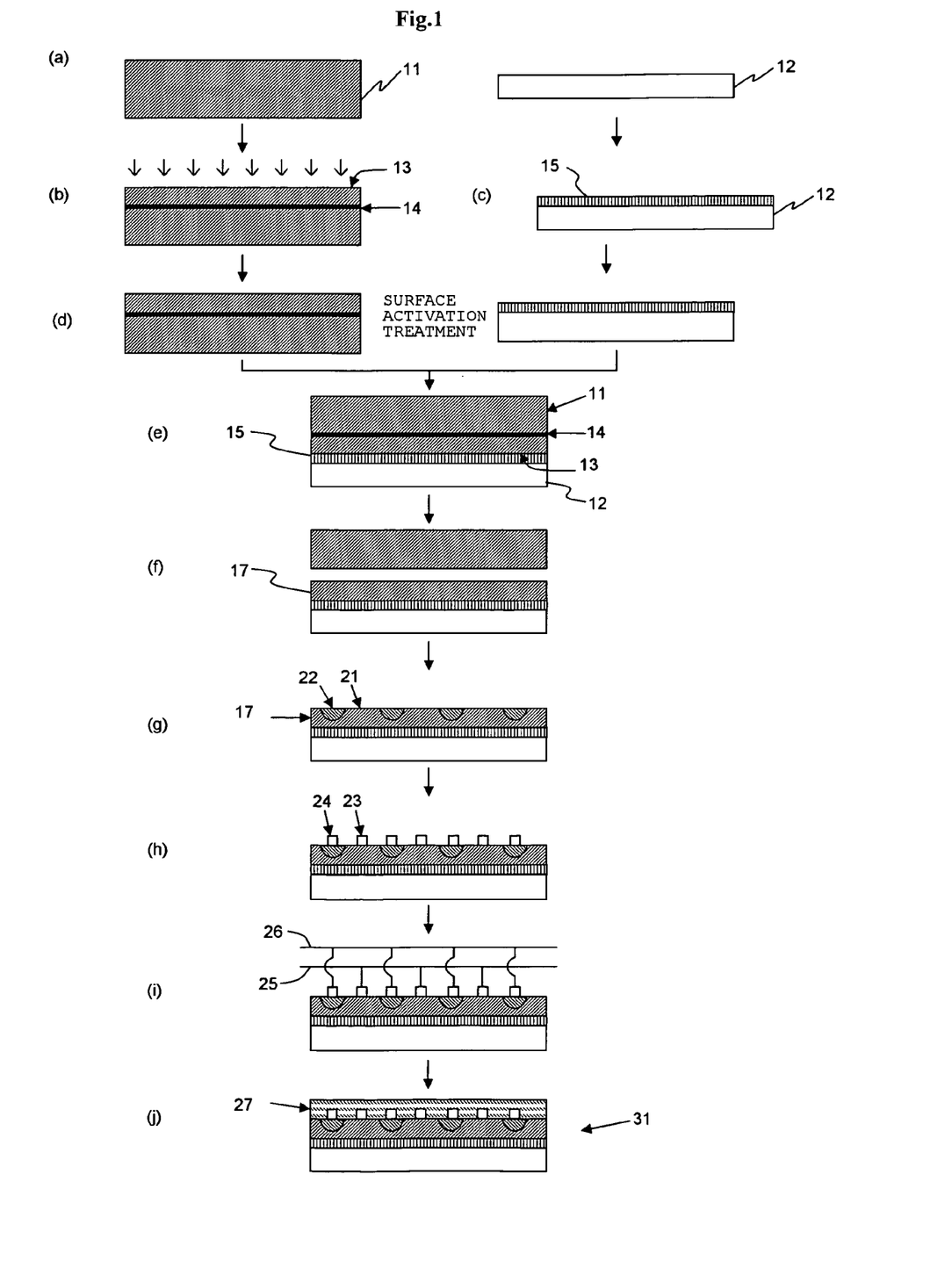
FIG. 1 is a process drawing showing an example of a method for manufacturing a single-crystal silicon solar cell according to the present invention.

FIG. 1 is a process diagram showing an example of a method for manufacturing a single-crystal silicon solar cell according to the present invention.

First, a single-crystal silicon substrate 11 and a metal substrate 12 are prepared (Step a).

Various kinds of substrates can be used as the single-crystal silicon substrate 11, and a substrate which is obtained by slicing a single crystal grown based on, e.g., a Czochralski method and has a diameter of 100 to 300 mm, a p or n conductivity type, and a resistivity of approximately 0.1 to 20 Ω·cm can be used, for example. Its thickness is not restricted in particular, and a substrate having a thickness of, e.g., approximately 500 to 2000 μm can be used.

It is to be noted that a conductivity type of the single-crystal silicon substrate prepared here is a first conductivity type.

Furthermore, as the metal substrate 12, using a substrate having a reflectivity of 60% or above with respect to a visible light is preferable. Specifically, a stainless substrate such as SUS304, an aluminum substrate, or a stainless substrate having silver deposited thereon (a silver deposited stainless substrate) can be used. When such a metal substrate is adopted, since a visible light is reflected with a high reflectivity, thereby manufacturing a solar cell having a higher efficiency. Moreover, when a thin-film substrate having flexibility is used as this metal substrate, a solar cell which can be disposed on a curved surface can be provided.

It is to be noted that using the single-crystal silicon substrate 11 whose surface to be bonded is sufficiently flattened is desirable in order to increase bonding strength at a bonding step which is later-explained Step e. Such a surface having high flatness can be realized by flattening the surface based on, e.g., polishing.

Subsequently, at least one of a hydrogen ion or a rare gas ion is implanted into the single-crystal silicon substrate 11 to form an ion implanted layer 14 (Step b).

For example, a temperature of the single-crystal silicon substrate is set to 200 to 350° C., and a predetermined dose of at least one of a hydrogen ion and a rare gas ion is injected with an injection energy that enables forming the ion implanted layer 14 at a depth, e.g., a depth falling within the range of 2 μm to 50 μm from a surface 13 which corresponds to a desired thickness of the single-crystal silicon layer. In this case, since the hydrogen ion is light in weight and can be further deeply injected from the ion implanted surface 13 with the same acceleration energy, this hydrogen ion is particularly preferable. The hydrogen ion may have a positive or negative electric charge, and a hydrogen gas ion as well as an atomic ion can be used. The rare gas ion may also have a positive or negative electric charge.

Further, when an insulating film such as a thin silicon oxide film is formed on the surface of the single-crystal silicon substrate in advance and ion implantation is carried out through this film, an effect of suppressing channeling of the implanted ion can be obtained.

A transparent insulator layer 15 is then formed on the metal substrate 12 (Step c).

As the transparent insulator layer 15, a layer containing at least one of a silicon oxide, a silicon nitride, and an aluminum oxide is preferable. When the transparent insulator layer containing such a material is adopted, a clean surface suitable for bonding the single-crystal silicon substrate 11 at Step e can be readily obtained, and a metal component can be prevented from being diffused into the single-crystal silicon layer from the bonding surface at the bonding step (Step e) and subsequent steps.

It is to be noted that the method for forming the transparent insulator layer 15 is not restricted in particular, and the method can be appropriately selected in accordance with a material and others. For example, in case of the silicon oxide, the silicon nitride, or the aluminum oxide, the transparent insulator layer 15 can be formed on the metal substrate by, e.g., a plasma CVD method.

Moreover, it is desirable for a surface of the transparent insulator layer 15 to be sufficiently flattened in order to increase bonding strength at the bonding step (Step e). Such a surface having high flatness can be realized by flattening the surface based on, e.g., polishing.

It is to be noted that the order of performing implantation of the ion into the single-crystal silicon substrate at Step b and formation of the transparent insulator layer on the metal substrate at Step c may be changed.

Then, at least one of the ion implanted surface 13 of the single-crystal silicon substrate 11 and the surface of the transparent insulator layer 15 on the metal substrate 12 is subjected to a surface activation treatment (Step d).

This surface activation treatment is carried out to enable firmly bonding the single-crystal silicon substrate 11 to the surface of the transparent insulator layer 15 on the metal substrate 12 at the next bonding step (Step e) without effecting a heat treatment at a high temperature, and it is intended to activate the surface to be bonded. Additionally, although the method of this treatment is not restricted in particular, this treatment can be preferably carried out based on at least one of a plasma treatment and an ozone treatment.

When performing the treatment using a plasma, any one of a low-frequency plasma, a high-frequency plasma, a normal-pressure plasma, and a low-pressure plasma can be selected. For example, the metal substrate 12 on which the single-crystal silicon substrate 11 and/or the metal substrate 12 having the transparent insulator layer 15 thereon subjected to cleaning, e.g., RCA cleaning is mounted in a vacuum chamber, a plasma gas is introduced, then the substrate is exposed to a high-frequency plasma of approximately 100 W for 5 to 10 seconds, and at least a surface to be bonded to at Step e, i.e., the ion implanted surface 13 of the single-crystal silicon substrate 11 or the surface of the transparent insulator layer 15 on the metal substrate 12 having the transparent insulator layer 15 formed thereon is subjected to the plasma treatment. The plasma gas is not restricted in particular. In case of performing the treatment with respect to the single-crystal silicon substrate, a plasma of an oxygen gas can be used when oxidizing the surface, or a hydrogen gas, an argon gas, a mixed gas of these gases, or a mixed gas of the hydrogen gas and a helium gas can be used when not oxidizing the surface. In case of performing the treatment with respect to the transparent insulator layer 15 on the metal substrate 12, any gas can be used.

When performing the treatment using an ozone, the single-crystal silicon substrate 11 and/or the metal substrate 12 on which the transparent insulator layer 15 is formed subjected to cleaning, e.g., RCA cleaning is mounted in a chamber in which atmospheric air has been introduced, a plasma gas such as a nitrogen gas or an argon gas is introduced, then a high-frequency plasma is generated, and oxygen in the atmospheric air is converted into an ozone, thereby performing the ozone treatment with respect to at least the surface to be subjected to the surface activation treatment.

Based on the surface activation treatment, e.g., the plasma treatment or the ozone treatment, an organic material on the surface of the single-crystal silicon substrate 11 and/or the transparent insulator layer 15 on the metal substrate 12 is oxidized and removed, and an OH group on the surface is increased and activated. Although performing this surface activation treatment with respect to both the surface of the single-crystal silicon substrate 11 and the surface of the transparent insulator layer 15 on the metal substrate 12 is preferable, it may be performed with respect to one of these surfaces.

Then, the ion implanted surface 13 of the single-crystal silicon substrate 11 is bonded to the surface of the transparent insulator layer 15 on the metal substrate 12 (Step e).

Since at least one of the ion implanted surface 13 of the single-crystal silicon substrate and the surface of the transparent insulator layer 15 on the metal substrate 12 is subjected to the surface activation treatment at Step d, both the surfaces can be firmly bonded with strength allowing resistance against mechanical delamination at a subsequent step by just pressing both the surfaces against each other under, e.g., a low pressure or a normal pressure at a room temperature to approximately 250° C. or preferably a temperature close to the room temperature.

This bonding step is carried out under a temperature condition of the room temperature to approximately 250° C., and a heat treatment at a high temperature of 300° C. or above is not performed. That is because thermal damages, cracks, or delamination may possibly occur due to a difference in thermal expansion coefficient between the respective layers when the high-temperature heat treatment is performed at 300° C. or above in a state where the single-crystal silicon substrate 11 is bonded to the transparent insulator layer 15 on the metal substrate 12. The high-temperature heat treatment at 300° C. or above is avoided in this manner until delamination and transference of the single-crystal silicon substrate 11 at later-explained Step f are completed.

Subsequently, an impact shock is given to the ion implanted layer 14 to mechanically delaminate the single-crystal silicon substrate 11, thereby providing a single-crystal silicon layer 17 (Step f).

In the present invention, since an impact shock is given to the ion implanted layer to effect mechanical delamination, thermal damages, cracks, or delamination involved by heating does not occur. In order to give an impact shock to the ion implanted layer, continuously or intermittently spraying a jet of a fluid, e.g., a gas or a liquid to a side surface of the bonded wafer can suffice, but the method is not restricted in particular as long as it is a method that causes mechanical delamination based on an impact shock.

It is to be noted that, at the time of mechanical delamination of the single-crystal silicon substrate, pressing an auxiliary substrate against at least a back surface of the metal substrate to effect delamination of the single-crystal silicon substrate is desirable. When the auxiliary substrate is used to perform mechanical delamination in this manner, a small crack due to warpage and a crystal defect caused owing to this crack can be prevented from being produced in the silicon single crystal layer 17 subjected to delamination and transference, thereby avoiding a reduction in a conversion efficiency of the solar cell. When both the substrates have a small thickness of approximately 1 mm or below, an effect obtained by this method is considerable. For example, when a thickness of the metal substrate is less than 1 mm, the auxiliary substrate is used to set a total thickness of the metal substrate and the auxiliary substrate to 1 mm or above, and then delamination is carried out. As the auxiliary substrate, using one having high rigidity is preferable.

Moreover, after performing delamination and transference of the single-crystal silicon substrate, a heat treatment that remedies an ion implantation damage near the surface of the single-crystal silicon layer 17 may be performed. At this point in time, the single-crystal silicon substrate 11 has been already subjected to delamination and transferred and serves as the thin-film single-crystal silicon layer 17, a crack or a defect involved by this crack is hardly newly introduced even if a heat treatment is performed at 300° C. or above. Additionally, this is also true in subsequent steps.

Then, a plurality of diffusion regions 22 which are of a second conductivity type different from a first conductivity type as a conductivity type of the single-crystal silicon substrate prepared at Step a are formed on a delaminated surface side of the single-crystal silicon layer 17. At this time, a plurality of p-n junctions are formed in at least a plane direction (a normal line of a p-n junction interface has at least a component facing the plane direction of the single-crystal silicon layer 17) so that a plurality of first conductivity type regions 21 and the plurality of second conductivity type regions 22 are present in the delaminated surface portion of the single-crystal silicon layer 17 (Step g).

When the single-crystal silicon substrate 11 prepared at Step a is formed of p-type single crystal silicon, the first conductivity type is a p type, and n-type diffusion regions are formed as the second conductivity type. On the other hand, when the prepared substrate is formed of n-type single crystal silicon, the first conductivity type is an n type, and p-type diffusion regions are formed as the second conductivity type. A specific method of forming the plurality of second conductivity type diffusion regions is as follows, for example. When the single-crystal silicon substrate 11 prepared at Step a is of the p type, an element ion of phosphorus is implanted into a plurality of regions (e.g., a plurality of parallel linear regions) on the surface of the single-crystal silicon layer 17 based on an ion implantation method, and the single-crystal silicon layer surface is subjected to flash lamp annealing or irradiated with an ultraviolet or deep ultraviolet laser beam having a high absorption coefficient and then subjected to a donor activation treatment, thereby forming a plurality of p-n junctions. At this time, it is desirable to appropriate adjust an ion implantation amount, a diffusion time, a diffusion temperature, and others so as to prevent a plurality of n-type diffusion layers from overlapping each other to form a single region. Further, such a plurality of p-n junctions may be formed by creating a paste-like composition containing phosphorus that forms a donor, applying this composition to a plurality of regions (e.g., a plurality of parallel linear regions) on the surface of the single-crystal silicon layer 17 by, e.g., a screen printing method, and subjecting the surface of the single-crystal silicon layer to flash lamp annealing, irradiation of an ultraviolet or deep ultraviolet laser beam having a high absorption coefficient, diffusion in, e.g., an infrared oven, and an activation treatment.

It is to be noted that the second conductivity type regions 22 may be formed to reach a junction interface of the single-crystal silicon layer 17 with respect to the metal substrate 12.

Further, the plurality of second conductivity type diffusion layers may be formed and, on the other hand, first conductivity type high-density diffusion regions may be respectively formed between the plurality of second conductivity type diffusion regions. For example, when diffusing, e.g., phosphorus in a plurality of regions on the p-type silicon substrate to form n-type diffusion regions, an element forming an acceptor, e.g., boron may be diffused and activated to form a plurality of p+ regions between the plurality of n-type diffusion regions by the same technique.

Then, a plurality of first individual electrodes 23 are formed on the plurality of first conductivity type regions 21 of the single-crystal silicon layer 17 and a plurality of second individual electrodes 24 are formed on the plurality of second conductivity type regions 22, respectively (a step h).

For example, a metal or a transparent conductive material is used on the surface of the single-crystal silicon layer 17 to form the plurality of first individual electrodes 23 on the plurality of first conductivity type regions 21 and form the plurality of second individual electrodes 24 on the plurality of second conductivity type regions 22 by, e.g., a vacuum evaporation method or a chemical sputtering method. Furthermore, a method of applying a paste-like individual electrode forming composition containing, e.g., a metal to the predetermined regions based on a printing method or the like and hardening this composition by a heat treatment can be likewise used, and various kinds of known methods can be adopted.

It is to be noted that the first individual electrodes 23 are prevented from being bonded to the second conductivity type regions 22 and prevent the second individual electrodes 24 from being bonded to the first conductivity regions 21.

It is to be noted that the diffusion region forming step (Step g) and the individual electrode forming step (Step h) can be simultaneously carried out as follows. That is, the electrode forming composition containing a dopant material serving as a donor or an acceptor may be applied to the predetermined regions by a printing method or an inkjet method and subjected to a heat treatment to harden and form the plurality of electrodes and to diffuse the dopant. The heat treatment in this example may be carried out based on, e.g., the flash lamp annealing, ultraviolet or deep ultraviolet laser irradiation having a high absorption coefficient on the single-crystal silicon layer surface, or an infrared oven.

Each application interval of the individual electrode forming composition can be set to 10 μm or above or set to 100 μm or above. Since the single-crystal silicon layer 17 according to the present invention does not have a crystal grain boundary and a mobility and a lifetime of a light production carrier are equivalent to those of the regular single-crystal silicon substrate, the interval of the individual electrode forming composition can be expanded be larger than those of a polysilicon thin film and an amorphous silicon thin film.

Subsequently, a first collecting electrode 25 connecting the plurality of first individual electrodes 23 and a second collecting electrode 26 connecting the plurality of second individual electrodes 24 are formed (Step i).

Although a conformation of wire connection in this example is not restricted in particular, the first collecting electrode 25 is prevented from coming into contact with the second conductivity type regions 22 or the second individual electrodes 24, and the second collecting electrode 26 is prevented from coming into contact with the first conductivity type regions 21 or the first individual electrodes 23.

Forming the first collecting electrode 25 and the second collecting electrode 26 in this manner enables efficiently taking out electrons and holes collected by the plurality of first individual electrodes 23 and the plurality of second individual electrodes 24.

Then, a transparent protective film 27 that covers the plurality of first conductivity type regions 21 and the plurality of second conductivity type regions 22 is formed (Step j).

This transparent protective film 27 has insulating properties to prevent the first individual electrodes 23 and the first collecting electrode 25 from being short-circuited with the second individual electrodes 24 and the second collecting electrode 26. The transparent protective film 27 is formed so as to bury the various kinds of electrodes formed on the single-crystal silicon layer 17. It is to be noted that the first collecting electrode 25 and the second collecting electrode 26 are omitted in FIG. 1(*j*).

It is to be noted that a material of the transparent protective film 27 is not restricted in particular, but a material having a high transmissivity for a visible light is desirable. For example, a silicon oxide, a silicon nitride, or an aluminum oxide can be used. Moreover, the method of forming the transparent protective film 27 is not also restricted in particular. For example, when the silicon oxide, the silicon nitride, or the aluminum oxide is adopted, the transparent protective film 27 can be formed by a deposition method such as various kinds of CVD methods or a reactive sputtering method.

Additionally, a thermal damage, delamination of the bonded surface, cracks, and others are not produced in manufacturing the single-crystal silicon solar cell which is manufactured at the steps a to j, and this solar cell is a thin-film single-crystal silicon solar cell 31 having the single-crystal silicon layer which is thin and has excellent film thickness uniformity and crystallinity. It is to be noted that a light receiving surface is on the transparent protective film 27 side, and the metal substrate 12 is a back surface reflection layer.

In order to improve the conversion efficiency of the solar cell, one means is providing a structure which produces light scattering on a side where a light enters and a side where the light is reflected on the back surface. Providing such a structure which produces light scattering can be realized by, e.g., giving light scattering properties to the transparent protective film 27 or the transparent insulator layer 15.

For example, forming the transparent insulator layer 15 of a material containing light scattering particles with a high refractive index or having small vacancies therein enables providing a light confinement structure in which an incident light path of a light is scattered on the back surface side of the single-crystal silicon layer at the time of an operation of the solar cell and a light path length of a light entering the single-crystal silicon layer can be further extended to allow the single-crystal silicon layer to absorb more light. As a result, the conversion efficiency of the solar cell can be improved. At this time, it is desirable for the fine particle having light scattering properties to have a size of approximately 0.1 µm or above and for the small vacancy to have a size of approximately 0.1 µm or above. As a material of the light scattering fine particles with a high refractive index, a titanium oxide, a molybdenum oxide, or a hafnium oxide can be selected.

Further, likewise, adopting a structure containing small transparent particles which have a size of approximately 0.1 µm or above and different refractive indices or a structure containing small vacancies in the transparent protective film 27 enables giving light scattering properties to the transparent protective film 27.

It is to be noted that the entire region of the transparent protective film 27 or the transparent insulator layer 15 does not have to have light scattering properties, and it may partially have light scattering properties. For example, forming the surface of the transparent protective film 27 as an irregular rough surface having a size of approximately 0.1 µm enables adding light scattering properties.

It is to be noted that various kinds of methods for forming the structure that produces light scattering can be respectively combined and carried out.

It is to be noted that the remaining single-crystal silicon substrate after delamination and transference of the single-crystal silicon layer 17 at Step f can be again utilized as the single-crystal silicon substrate 11 by smoothening and removing the delaminated rough surface and the ion implanted layer based on polishing and repeatedly performing the ion implantation processing. In the method for manufacturing a single-crystal silicon solar cell according to the present invention, since the single-crystal silicon substrate does not have to be heated to 350° C. or above at the steps from the ion implantation step to the delamination step, oxygen induced defects are not introduced in the single-crystal silicon substrate. Therefore, in a case where the single-crystal silicon substrate having a thickness of approximately 1 mm or a slightly smaller thickness is used from the beginning, when a film thickness of the single-crystal silicon layer 17 is set to 5 µm, delamination and transference can be performed 100 times or more. When this film thickness is set to 50 µm, delamination and transference can be repeated 10 times or more.

Figure 2:
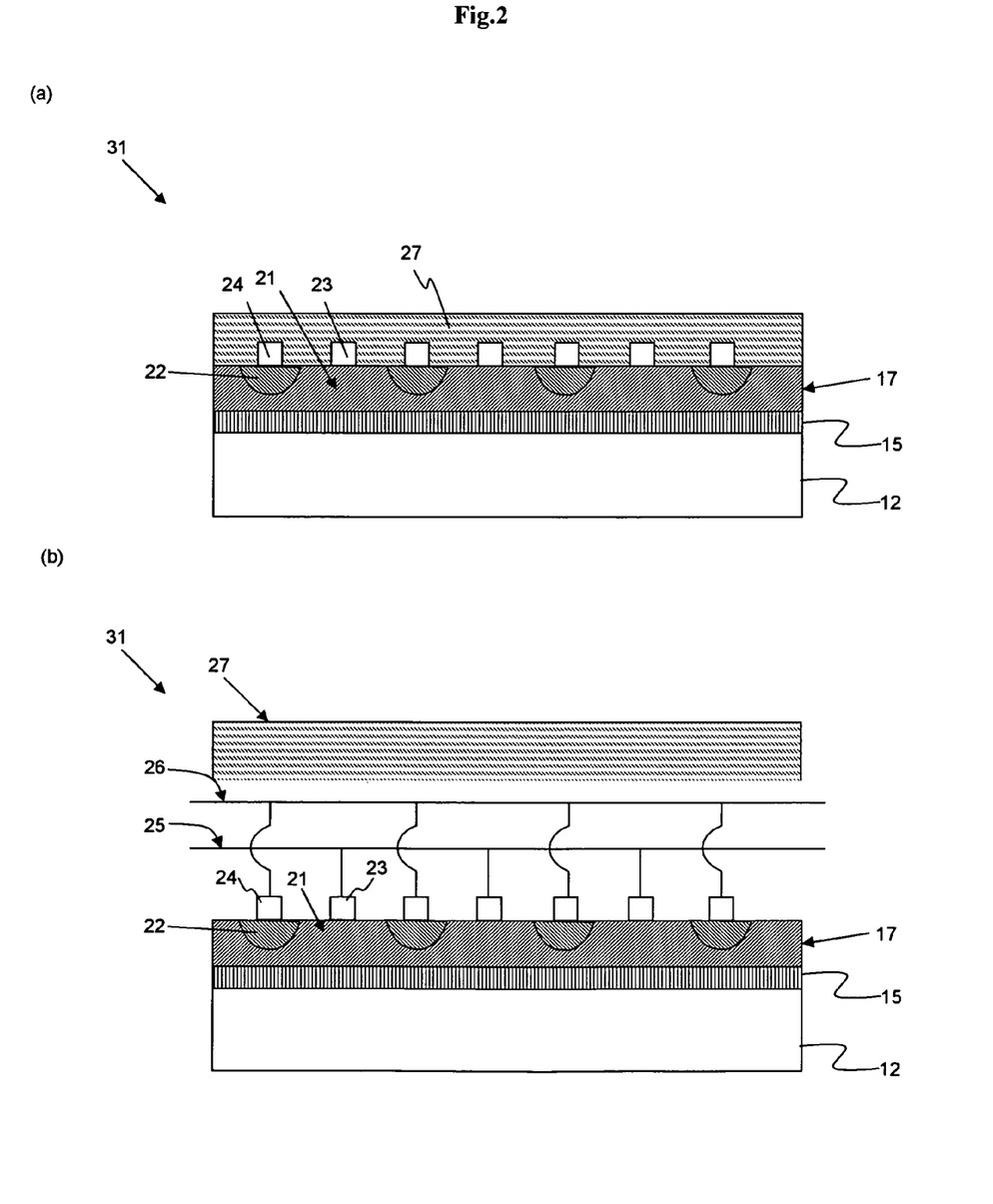
FIG. 2(a) is a schematic cross-sectional view where each collecting electrode is omitted and FIG. 2(b) is a schematic cross-sectional view schematically showing a state of wire connection of each collecting electrode.

In the single-crystal silicon solar cell 31 manufactured by such a manufacturing method, as depicted in FIG. 2(*a*) showing an outline structure and FIG. 2(*b*) schematically showing a wire connection pattern of the electrodes, the metal substrate 12, the transparent insulator layer 15, the single-crystal silicon layer 17, and the transparent protective film 27 are sequentially laminated, and the plurality of first conductivity type regions 21 and the plurality of second conductivity type regions 22 are formed in the surface (the delaminated surface) of the single-crystal silicon layer 17 on the transparent protective film 27 side. The plurality of p-n junctions are formed in at least the plane direction (a normal line of each p-n junction interface has at least a component facing the plane direction of the single-crystal silicon layer 17). The plurality of first individual electrodes 23 are respectively formed on the plurality of first conductivity type regions 21 of the single-crystal silicon layer 17, and the plurality of second individual electrodes 24 are respectively formed on the plurality of second conductivity type regions 22 of the same. The first collecting electrode 25 connecting the plurality of first individual electrodes 23 and the second collecting electrode 26 connecting the plurality of second individual electrodes 24 are formed.

In the solar cell 31 having such a structure, a light enters from the transparent protective film 27 side, the light is partially absorbed into the single-crystal silicon layer 17 to be converted into electric power by the p-n junctions, and the electric power is taken out by the respective electrodes.

Furthermore, since the single-crystal silicon solar cell 31 has the metal substrate 12 on the side opposite to the transparent protective film 27 side, even when a part of the light which has entered from the transparent protective film 27 side is transmitted through the single-crystal silicon layer 17 without being absorbed therein, it is reflected by the metal substrate 12, and it can be again transmitted through the single-crystal silicon layer 17, thereby increasing an entire light absorption factor. In particular, when the metal substrate has a reflectivity of 60% or above with respect to a visible light like a stainless substrate such as SUS304, an aluminum substrate, or a silver deposited stainless substrate, it is possible to provide the solar cell in which a visible light transmitted through the thin-film single-crystal silicon layer is highly efficiently reflected on the metal substrate interface and again absorbed into the thin-film single-crystal silicon layer to be subjected to photoelectric conversion. In order to increase the conversion efficiency in the thin-film single-crystal silicon solar cell whose thickness is reduced by using the single-crystal silicon layer having a light absorption factor greatly lower than that of amorphous silicon as the light conversion layer, a so-called light confinement structure, e.g., this back-surface reflecting plate (the metal substrate) is effective.

Moreover, when the structure in which the transparent protective film 27 has light scattering properties or the transparent insulator layer 15 has light scattering properties is provided by the above-explained method, this structure serves as the light confinement structure where scattering a light enables further extending a light path length of the light entering the single-crystal silicon layer 17 and the single-crystal silicon layer 17 can absorb more light.

Additionally, when the metal substrate is a thin film-like or thin-plate-like substrate having flexibility, the solar cell which can be spread in a curved surface shape, rolled to be accommodated, or spread and used as required can be provided.

Further, when the single-crystal silicon solar cell in which the single-crystal silicon layer 17 has a thickness falling with the range of 2 µm to 50 µm is provided by the above-explained method, an efficiency practical as the thin-film single-crystal silicon solar cell can be obtained, and an amount of a silicon raw material to be used can be economized.

EXAMPLES

The present invention will now be specifically explained based on an example.

Example 1

As the single-crystal silicon substrate 11, a p-type single-crystal silicon substrate having a diameter of 200 mm (eight inches), a crystal plane (100), and a surface resistance of 15 Ωcm was prepared. Furthermore, as the metal substrate 12, a substrate obtained by depositing 20 nm of silver on stainless (SUS304) having a thickness of 200 µm and a diameter of 200 mm by an evaporation method (a silver deposited stainless substrate) was prepared (step a).

Then, surface roughness of one main surface (a surface 13 subjected to ion implantation at a later step) of the single-crystal silicon substrate was set to 0.5 nm or below by CMP polishing. Subsequently, a hydrogen positive ion was implanted into this polished surface 13 with an acceleration voltage of 350 keV under a condition of a dose amount 1.0×10$^{17}$/cm$^2$ (Step b). A depth of an ion implanted layer 14 was approximately 3 µm from the ion implanted surface 13.

Then, a thin film of a silicon oxide having a thickness of 200 nm was formed as the transparent insulator layer 15 on the prepared silver deposited stainless substrate by using tetraalkoxysilane based on a plasma CVD method (Step c). Surface roughness of this thin film of the silicon oxide was set to 0.5 nm or below based on CMP polishing.

Subsequently, the ion implanted surface 13 of the single-crystal silicon substrate 11 and the surface of the transparent insulator layer 15 on the metal substrate 12 were subjected to a surface activation treatment by being exposed to a nitrogen plasma for 15 seconds based on a low-pressure plasma method (Step d).

Then, the surfaces subjected to the surface activation treatment were used as bonding surfaces to firmly bond the single-crystal silicon substrate 11 to the metal substrate 12 having the transparent insulator layer 15 formed thereon (Step e).

Subsequently, a high-pressure nitrogen gas was sprayed to a portion near a bonding interface, and then mechanical delamination was performed so as to peel off the single-crystal silicon substrate 11 in such a manner that delamination starts from the surface sprayed with the gas (Step f). At this time, delamination was performed after the single-crystal silicon substrate 11 and the metal substrate 12 were caused to adsorb an auxiliary substrate from a back surface.

Further, an irradiation heat treatment was performed with respect to the single-crystal silicon layer 17 subjected to delamination and transference under a condition that its surface instantaneously has a temperature of 700° C., thereby remedying a hydrogen implantation damage.

Many linear patterns were printed on the surface of the single-crystal silicon layer 17 based on a screen printing method utilizing a diffusion paste that utilizes ethyl cellosolve containing phosphorus glass as a thickening agent. Then, irradiation was performed by using a flash lamp to increase a temperature of the surface to 600° C. or above, thereby forming a plurality of n-type diffusion regions 22 each having a junction depth of approximately 1 µm (Step g). As a result, p-type regions 21 and the n-type regions 22 were alternately present in the surface of the single-crystal silicon layer 17, and a plurality of p-n junctions were formed in a plane direction.

Cleaning was performed to removed this diffusion paste by using a fluorinated acid, acetone, and isopropyl alcohol, and then first individual electrodes 23 were formed on the plurality of p-type regions 21 and a plurality of second individual electrodes 24 were formed on the plurality of n-type regions 22 by a vacuum evaporation method and a patterning method using silver as an electrode material (a step h).

Thereafter, a first collecting electrode 25 was formed so as to connect the plurality of first individual electrodes 23 through wires and a second collecting electrode 26 was formed so as to connect the plurality of second individual electrodes 24 through wires by using silver as an electrode material based on the vacuum evaporation method utilizing a metal mask (Step i).

Subsequently, a film of a silicon nitride (the transparent protective film 27) was formed on a surface excluding extraction electrode portions by a reactive sputtering method (Step j).

In this manner, the thin-film single-crystal silicon solar cell 31 in which the metal substrate 12, the transparent insulator layer 15, and the single-crystal silicon layer 17 having the p-n junction formed therein, the various electrodes, and the transparent protective film 27 are laminated was manufactured as shown in FIGS. 2(a) and (b).

The thus manufactured single-crystal silicon solar cell 31 was irradiated with a light of 100 mW/cm$^2$ at AM 1.5 by using a solar simulator to measure a conversion efficiency. The conversion efficiency was 12%, and no aged change was observed.

The high conversion efficiency was obtained even though the thin-film single-crystal silicon solar cell in which a light conversion layer has a very small thickness of 3 μm was used. It can be considered that such a high conversion efficiency can be obtained because a light confinement structure where the silicon layer as the light conversion layer is formed of single-crystal silicon having excellent crystallinity and a back surface serves as a light reflection metal layer is adopted.

It is to be noted that the present invention is not restricted to the foregoing example. The example is just an exemplification, and any examples which have substantially the same structures as the technical concept described in claims of the present invention and demonstrates the same functions and effects are included in the technical concept of the present invention.

What is claimed is:

1. A method for manufacturing a single-crystal silicon solar cell in which at least a metal substrate, a single-crystal silicon layer as a light conversion layer, and a transparent protective film are laminated and the transparent protective film side serves as a light receiving surface, the method comprising the steps of:

preparing the metal substrate and a single-crystal silicon substrate which is of a first conductivity type;

implanting at least one of a hydrogen ion and a rare gas ion into the single-crystal silicon substrate to form an ion implanted layer;

forming a transparent insulator layer having light scattering properties on the metal substrate, the light scattering properties being provided by light scattering particles in the transparent insulator layer or vacancies therein;

performing a surface activation treatment with respect to at lest one of the ion implanted surface of the single-crystal silicon substrate and a surface of the transparent insulator layer on the metal substrate;

bonding the ion implanted surface of the single-crystal silicon substrate to the surface of the transparent insulator layer on the metal substrate;

giving an impact shock to the ion implanted layer and mechanically delaminating the single-crystal silicon substrate to provide the single-crystal silicon layer;

forming a plurality of diffusion regions which are of a second conductivity type different from the first conductivity type in the delaminated surface side of the single-crystal silicon layer and forming a plurality of p-n junctions in at least a plane direction so that a plurality of first conductivity type regions and the plurality of second conductivity type regions are present in the delaminated surface of the single-crystal silicon layer;

forming a plurality of first individual electrodes on the plurality of first conductivity type regions of the single-crystal silicon layer and forming a plurality of second individual electrodes on the plurality of second conductivity type regions of the same;

forming a first collecting electrode connecting the plurality of first individual electrodes and a second collecting electrode connecting the plurality of second individual electrodes; and forming a transparent protective film that covers the plurality of first conductivity type regions and the plurality of second conductivity type regions.

2. The method for manufacturing a single-crystal silicon solar cell according to claim 1, wherein the metal substrate has a reflectivity of 60% or above with respect to a visible light.

3. The method for manufacturing a single-crystal silicon solar cell according to claim 1, wherein the transparent insulator layer contains at least one of a silicon oxide, a silicon nitride, and an aluminum oxide.

4. The method for manufacturing a single-crystal silicon solar cell according to claim 2, wherein the transparent insulator layer contains at least one of a silicon oxide, a silicon nitride, and an aluminum oxide.

5. The method for manufacturing a single-crystal silicon solar cell according to claim 1, wherein the surface activation treatment is at least one of a plasma treatment and an ozone treatment.

6. The method for manufacturing a single-crystal silicon solar cell according to claim 4, wherein the surface activation treatment is at least one of a plasma treatment and an ozone treatment.

7. The method for manufacturing a single-crystal silicon solar cell according to claim 1, wherein a depth of the ion implantation is set to fall within the range of 2 μm to 50 μm from the ion implanted surface.

8. The method for manufacturing a single-crystal silicon solar cell according to claim 6, wherein a depth of the ion implantation is set to fall within the range of 2 μm to 50 μm from the ion implanted surface.

9. The method for manufacturing a single-crystal silicon solar cell according to claim 1, wherein the transparent protective film has light scattering properties.

* * * * *